(12) United States Patent
Sridharan et al.

(10) Patent No.: US 10,134,689 B1
(45) Date of Patent: Nov. 20, 2018

(54) WARPAGE COMPENSATION METAL FOR WAFER LEVEL PACKAGING TECHNOLOGY

(71) Applicant: Maxim Integrated Products, Inc., San Jose, CA (US)

(72) Inventors: Vivek S. Sridharan, Lewisville, TX (US); Amit S. Kelkar, Flower Mound, TX (US); Sriram Muthukumar, Allen, TX (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 15/280,462

(22) Filed: Sep. 29, 2016

Related U.S. Application Data

(63) Continuation of application No. 13/779,876, filed on Feb. 28, 2013, now abandoned.

(51) Int. Cl.
*H01L 23/00* (2006.01)
*H01L 21/683* (2006.01)
*H01L 23/58* (2006.01)

(52) U.S. Cl.
CPC ........ *H01L 23/562* (2013.01); *H01L 21/6836* (2013.01); *H01L 23/585* (2013.01); *H01L 24/13* (2013.01); H01L 2221/68327 (2013.01); H01L 2224/13017 (2013.01); H01L 2224/13111 (2013.01); H01L 2224/13139 (2013.01); H01L 2224/13147 (2013.01); H01L 2224/13155 (2013.01)

(58) Field of Classification Search
None
See application file for complete search history.

(56) References Cited

U.S. PATENT DOCUMENTS

| | | |
|---|---|---|
| 2003/0197285 A1 | 10/2003 | Strandberg et al. |
| 2008/0248610 A1* | 10/2008 | Chew ............ H01L 24/13 438/108 |
| 2009/0283895 A1 | 11/2009 | Kikuchi et al. |
| 2011/0175213 A1* | 7/2011 | Mori ............. H01L 23/13 257/675 |
| 2012/0091577 A1* | 4/2012 | Hwang ........... H01L 24/11 257/737 |
| 2013/0099250 A1* | 4/2013 | Hua ............ H01L 29/0657 257/77 |

OTHER PUBLICATIONS

Giacomini, Davide, "A novel high efficient approach to input bridges," Presented at PCIM Europe, May 27-29, 2008, Nuremberg, Germany, pp. 1-7.

* cited by examiner

*Primary Examiner* — Whitney T Moore
(74) *Attorney, Agent, or Firm* — Kevin E. West; Advent, LLP

(57) ABSTRACT

A wafer level package device and method are disclosed that include a warpage compensation metal adhered to a backside of a semiconductor wafer for minimizing warpage of the semiconductor wafer, where multiple metal features have been formed on the device side of the semiconductor substrate. The warpage compensation metal may include a copper film.

19 Claims, 3 Drawing Sheets

WARPAGE COMPENSATION METAL FOR WAFER LEVEL PACKAGING TECHNOLOGY

BACKGROUND

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Traditional fabrication processes used in the manufacture of semiconductor devices employ microlithography to pattern integrated circuits onto a circular wafer formed of a semiconductor such as silicon, gallium arsenide, and so forth. Often, the patterned wafers are segmented into individual integrated circuit chips or dies to separate the integrated circuits from one another. The individual integrated circuit chips may be assembled or packaged using a variety of packaging technologies to form semiconductor devices that may be mounted to a printed circuit board.

SUMMARY

A semiconductor device and wafer package is described that includes a processed semiconductor wafer with a warpage compensation metal and an adhesive film laminated to the backside of the semiconductor wafer. The adhesive film is disposed between the warpage compensation metal and a backside of the semiconductor wafer and is cured post metal feature plating. In an implementation, the warpage compensation metal may include a metal film that is adhered with epoxy to the backside of a metal feature plated semiconductor wafer. In this implementation, the metal warpage compensation metal functions to prevent significant warpage of the semiconductor wafer and helps prevent wafer backside chipping and die-edge cracking when singulating the wafer into individual die. Warpage compensation metal would also offer improved board solder joint reliability performance by reducing the composite CTE of the packaged device with that of the board. Additionally, with the warpage compensation metal laminated to the semiconductor wafer, wafer warpage is within the limits of automated processing and testing.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

A 3D die can be constructed using two or more layers of electronic components integrated into a single chip, often from stacking and processing semiconductor wafers. The electronic components may be stacked to form a single electrical circuit. However, when a semiconductor wafer is plated with thick metal features such as pillars and thermally treated, warpage and bowing of the semiconductor wafer may occur. This warpage can prevent effective vacuum chucking-ability and handling. Additionally, a semiconductor wafer may be segmented into individual dies and may chip on the backside and crack along the die edges during the singulation process.

Accordingly, a semiconductor device and wafer package is described that includes a processed semiconductor wafer with a warpage compensation metal and an adhesive film attached to the backside of the semiconductor wafer post metal feature plating. The adhesive film is cured post metal feature plating on a device side of the semiconductor wafer and is disposed between the backside of the semiconductor wafer and the warpage compensation metal. In an implementation, the warpage compensation metal may include a copper film that is adhered with an epoxy adhesive film to the backside of a copper feature plated semiconductor wafer. In this implementation, the copper warpage compensation metal functions to prevent significant warpage of the semiconductor wafer and helps prevent backside chipping and die-edge cracking when singulating the wafer into individual die. Warpage compensation metal would also offer improved board solder joint reliability performance by reducing the composite CTE of the packaged device with that of the board. With the warpage compensation metal laminated to the semiconductor wafer, wafer warpage is within the limits of automated processing and testing.

Example Implementations

Figure 1:
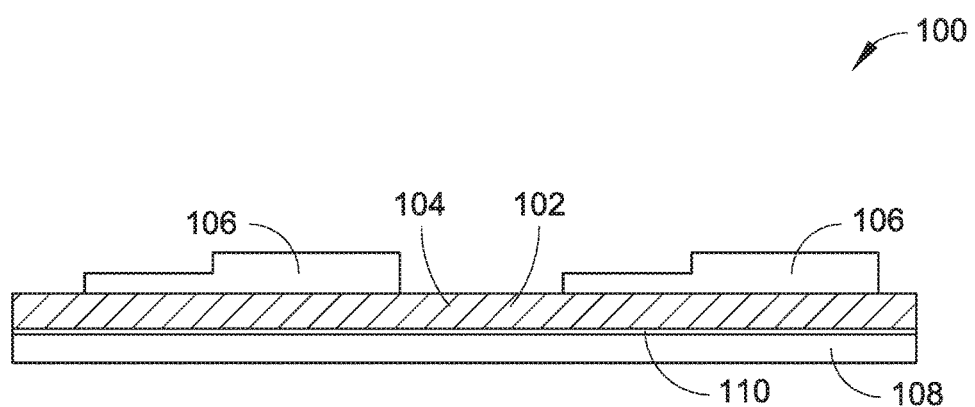
FIG. 1 is a diagrammatic partial cross-sectional side elevation view illustrating a wafer level package device including a warpage compensation metal formed on the backside of a semiconductor wafer in accordance with an example implementation of the present disclosure.

FIG. 1 illustrates wafer level package devices 100 including a warpage compensation metal 108 and an adhesive film 110 laminated to the backside of a semiconductor wafer in accordance with example implementations of the present disclosure. As shown, the warpage compensation metal 108 and the adhesive film 110 is laminated to the backside of the semiconductor wafer 102 subsequent to forming at least one metal feature on the device side of the semiconductor wafer 102.

FIG. 1 illustrates a wafer level package device 100 including a semiconductor wafer 102. The semiconductor wafer 102 includes a base material utilized to form one or more integrated circuits 104 through various semiconductor fabrication techniques, for example, photolithography, ion implantation, deposition, etching, and so forth. In one or more implementations, the semiconductor wafer 102 comprises a silicon wafer that may be configured in a variety of ways. For example, the semiconductor wafer 102 may comprise a portion of an n-type silicon wafer or a portion of a p-type silicon wafer. In an implementation, the semiconductor wafer 102 may comprise group V elements (e.g., phosphorus, arsenic, antimony, etc.) configured to furnish n-type charge carrier elements. In another implementation, the semiconductor wafer 102 may comprise group IIIA elements (e.g., boron, etc.) configured to furnish p-type charge carrier elements.

As shown in FIG. 1, the wafer level package device 100 includes at least one metal feature 106 formed on the device side of the semiconductor wafer 102. In implementations, the at least one metal feature 106 may include copper pillars. In some implementations, the at least one metal feature 106 may include thick copper pillar features (e.g., ≥30 μm tall). In one implementation, the wafer level package device 100 includes a field effect transistor (FET) wafer having multiple metal pillars approximately 60-200 μm tall. In another specific implementation, a wafer level package device 100 includes a semiconductor wafer 102 with a silicon thickness of approximately 725 μm, 28 μm of wafer level packaging, and between 80 μm to 200 μm of metal features 106. Other features may be formed on the semiconductor wafer in addition to the metal features 106.

As shown in FIG. 1, the wafer level package device 100 includes a warpage compensation metal 108 adhered to the backside of the semiconductor wafer 102 with an adhesive film 110. In implementations, the warpage compensation metal 108 may include a copper film and/or a copper-clad adhesive film. The warpage compensation metal 108 may also include other metals, alloys, or a composite of multiple metals and/or alloys (e.g., copper, nickel, tin, tin-silver, etc.). In an implementation, the warpage compensation metal 108 may include an electro-deposited copper film or a rolled copper foil. In another implementation, the warpage compensation metal 108 includes a copper film with a nickel coating, where the nickel coating functions to prevent oxidation of the copper. The composition of the warpage compensation metal 108 may be chosen for its capacity to prevent semiconductor wafer 102 warpage subsequent to formation of the metal features 106 on the device side of the semiconductor wafer 102. In an implementation, the warpage compensation metal 108 includes a copper film with a thickness of approximately 20 μm to 40 μm. However, other warpage compensation metal 108 thicknesses may be used based on the interconnect scheme and density on the device side of the semiconductor wafer 102. In some embodiments, the warpage compensation metal 108 includes a patterned film configured to expose at least one die street, which is a thin non-functional spacing where a saw can safely cut the wafer level package device without damaging the circuits in the wafer. In other embodiments, the warpage compensation metal 108 includes a blanket film, which is a film that may be deposited, patterned, and then etched. Additionally, the warpage compensation metal 108 and the at least one metal feature 106 may be different metals or may be the same metals. In an embodiment, the warpage compensation metal 108 and the at least one metal feature 106 are different metals. In this embodiment, the coefficient of thermal expansion (CTE) and the modulus of the two metals are closely matched so that any warpage on the front side of the wafer (e.g., the side with the at least one metal feature 106) is compensated by similar warpage on the backside of the wafer (e.g., the side with the warpage compensation metal 108). In this embodiment, the two metals have a CTE between the CTE of silicon (e.g., 2.6 ppm/° C.) and the CTE of copper (e.g., about 17 ppm/° C.).

The warpage compensation metal 108 is adhered to the backside of the semiconductor wafer 102 with an adhesive film 110. Some examples of material used for the adhesive film 110 may include an epoxy or a high temperature adhesive (e.g., polyimide, dielectrics, etc). In some implementations, the adhesive film 110 includes a film with a thickness between 5 μm and 20 μm. Further, it is necessary for the adhesive film 110 to be fully cured after the warpage compensation metal 108 is attached to the semiconductor wafer 102 or there may be a risk of delamination during subsequent downstream process steps. After a full curing step, the adhesive film 110 is thermomechanically coupled with the semiconductor wafer 102, which provides warpage balancing during subsequent thermal steps.

Additionally, the adhesive film 110 material may be selected for other suitable characteristics. For example, the material used for the adhesive film 110 may cure at low enough temperatures (e.g., 100° C.-200° C.) to avoid wafer warping during a curing step. Moreover, the material thickness utilized for the adhesive film 110 may be sufficient to function as an effective barrier to copper migration while not increasing the thermal resistance of the warpage compensation metal 108. In implementations, the material used for the adhesive film 110 includes a high thermally conductive adhesive, although other materials may be used. The adhesive film 110 may also require a material that satisfactorily adheres to the semiconductor wafer material (e.g., silicon) and the warpage compensation metal 108 material (e.g., copper). In an implementation, the adhesive film 110 may have a low coefficient of thermal expansion (CTE) between the CTE of the semiconductor wafer 102 and the CTE of the warpage compensation metal 108. In this specific implementation, the adhesive film may have a CTE between the CTE of silicon (e.g., 2.6 ppm/° C.) and the CTE of copper (e.g., about 17 ppm/° C.). Other characteristics of the adhesive film 110 may include a high glass transition temperature ($T_g$) (e.g., ≥150° C.).

Example Fabrication Processes

Figure 2:
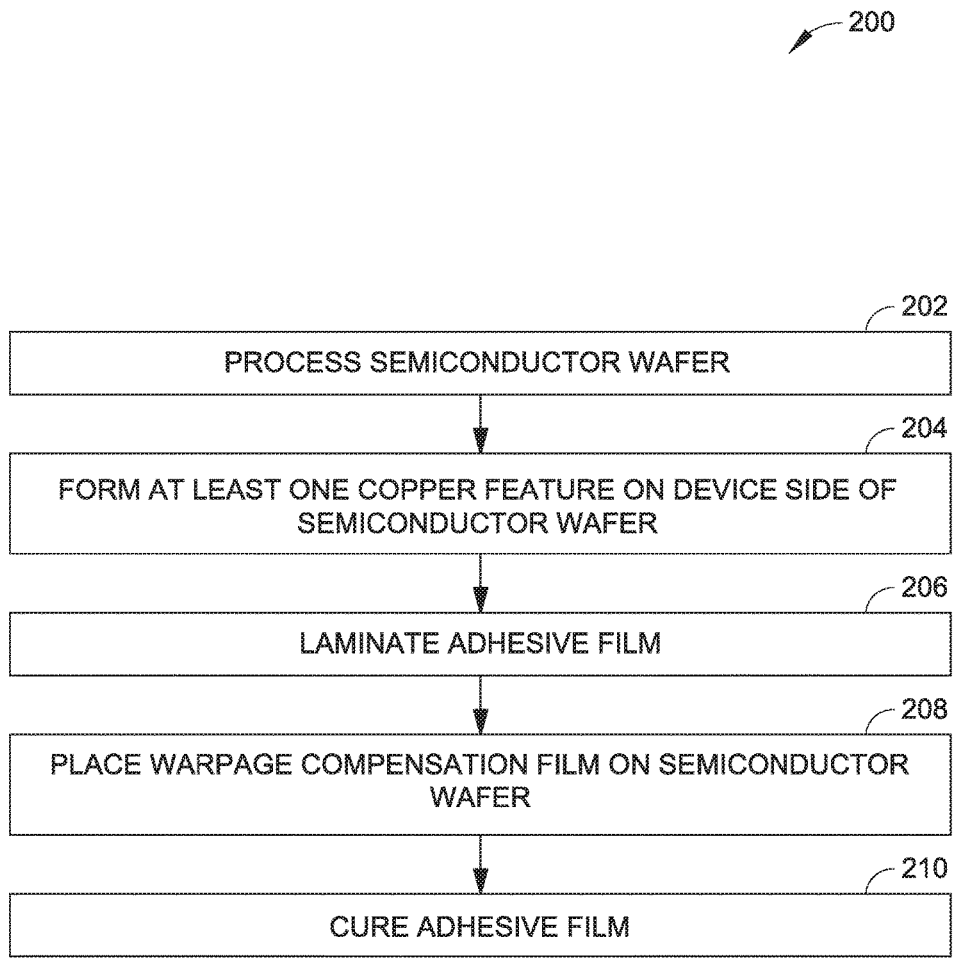
FIG. 2 is a flow diagram illustrating a process in an example implementation for fabricating wafer level packages, such as the wafer level package device shown in FIG. 1.
Figure 3A:
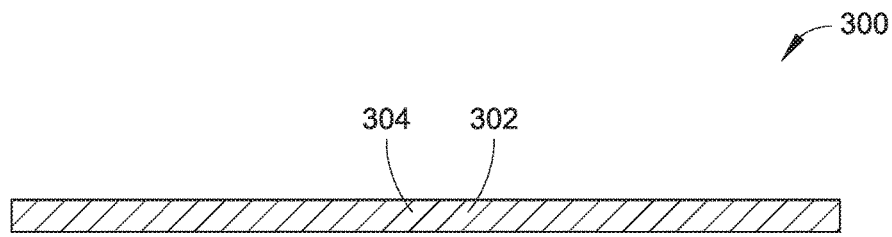
FIGS. 3A through 3C are diagrammatic partial cross-sectional side elevation views illustrating the fabrication of wafer level packages, such as the wafer level package device shown in FIG. 1, in accordance with the process shown in FIG. 2.
Figure 3B:
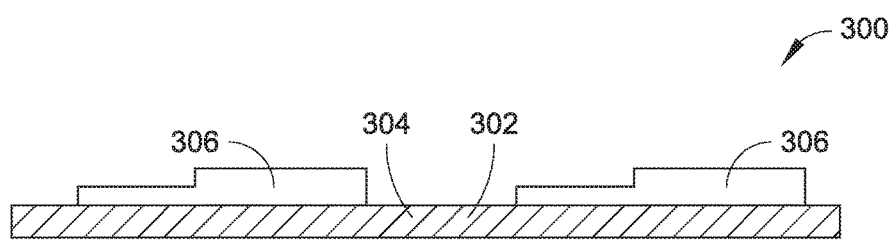
Figure 3C:
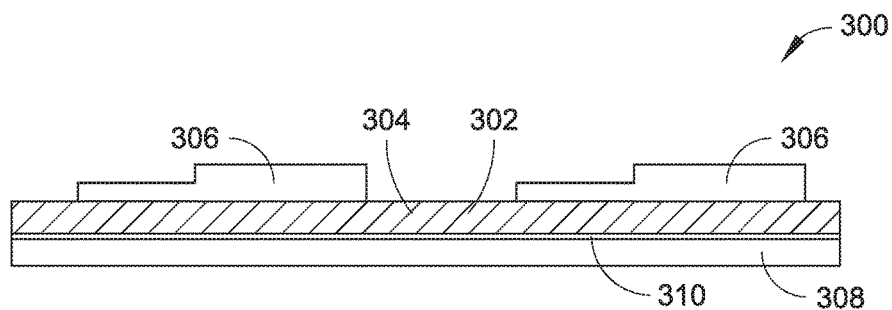

FIG. 2 illustrates an example process 200 that employs semiconductor packaging techniques to fabricate a wafer level package, such as the wafer level package device 100 shown in FIG. 1. FIGS. 3A through 3C illustrate a section of a semiconductor wafer 302 during fabrication of an example wafer level package device 300 (such as the wafer level package device 100 shown in FIG. 1).

As shown in FIG. 2, a semiconductor wafer is processed (Block 202). In the wafer level package device 300 illustrated in FIG. 3A, a section of the semiconductor wafer 302 is illustrated prior to formation of at least one metal feature 306 on the semiconductor wafer 302. Processing the semiconductor wafer 302 may include processing a silicon wafer, a germanium wafer, and so forth, and processing may include processing one or more integrated circuits 304 formed therein. Processing the integrated circuits 304 may include forming through suitable front-end-of-line (FEOL) fabrication techniques. The integrated circuits 304 may be configured in a variety of ways. For example, the processed integrated circuits 304 may include digital circuit technology, analog circuit technology, mixed-signal technology, and so forth.

Next, at least one metal feature is formed on a device side of the semiconductor wafer (Block 204). As illustrated in FIG. 3B, metal features 306 may be formed using, for example, lamination, deposition, and etching processes. Some examples of forming a metal feature 306 may include forming a copper pillar, such as a copper pillar used in interconnect assemblies (e.g., copper pillar solder bumps). In implementations, the height of the formed metal features 306 may equal or exceed 30 µm. In one implementation, forming an array of metal features 306 includes forming an array of metal features at a height of approximately 80 µm to 120 µm. In some implementations, the formed metal features 306 may include a solder cap.

An adhesive film is laminated (Block 206) to provide a reliable attachment interface between the warpage compensation metal and the semiconductor wafer. In the embodiment shown in FIG. 3C, the adhesive film 310 is shown disposed between the warpage compensation metal 308 and the semiconductor wafer 302. In some implementations, the adhesive film 310 is initially attached to the backside of the semiconductor wafer 302, and the warpage compensation metal 308 is subsequently disposed on the adhesive film 310. In other implementations, the adhesive film 310 may be initially disposed on the warpage compensation metal 308, where the warpage compensation metal 308 and adhesive film 310 are then disposed on the semiconductor substrate 302. In implementations, the adhesive film 310 may be disposed on the warpage compensation metal 308 and/or the semiconductor wafer 302 using processes that include chemical deposition (e.g., plating, chemical solution deposition, spin coating, chemical vapor deposition, etc.) and/or physical deposition (e.g., sputtering). Additionally, the adhesive film 310 may be pre-formed as a sheet and/or roll and may be disposed on the warpage compensation metal 308 and/or semiconductor wafer 302 in sheet form.

A warpage compensation metal is disposed on the backside of the semiconductor wafer (Block 208). As shown in FIG. 3C, the warpage compensation metal 308 is disposed on the adhesive film 310, which is disposed on the backside of the semiconductor wafer 302. The warpage compensation metal 308 may be disposed or formed on the adhesive film 310 disposed on the semiconductor wafer 302 using methods that include, for example, chemical deposition (e.g., plating, chemical solution deposition, spin coating, chemical vapor deposition, etc.) and/or physical deposition (e.g., sputtering). Another method for disposing a warpage compensation metal 308 on an adhesive film 310 may include disposing an electro-deposited copper layer on the adhesive film 310. Additionally, the warpage compensation metal 308 may be formed as a foil (e.g., rolled copper) prior to application on the adhesive film 310 or prior to application of the adhesive film 310 on the warpage compensation metal 308. In an implementation, disposing a warpage compensation metal 308 on the backside of the semiconductor wafer 302 may include sputtering a copper film onto an adhesive film 310, which has been formed on the backside of the semiconductor wafer 302. In another implementation, disposing a warpage compensation metal 308 on the backside of a semiconductor wafer 302 may include disposing a copper film that has been pre-formed as a foil with an adhesive film 310 laminated onto the copper film onto the backside of the semiconductor wafer 302. Further, the warpage compensation metal 308 may be plated on the adhesive film 310 or the semiconductor wafer 302 using a plating process. In one implementation, disposing the warpage compensation metal 308 may include disposing a layer of copper on the adhesive film 310 and semiconductor wafer 302 using electrolytic plating, which includes a process where metal ions in a solution are moved using an electric field. A further implementation may include disposing a warpage compensation metal 308 onto the adhesive film 310 and the backside of a semiconductor wafer 302 where the warpage compensation metal 308 (e.g., a copper or other metal film) is patterned to expose the die streets (spacing between the functional parts of each integrated circuit where a saw safely cuts the semiconductor wafer) while still providing for the desired warpage compensation.

Next, the adhesive film is cured (Block 210). As shown in FIG. 3C, the adhesive film 310 is cured subsequent to being disposed between the warpage compensation metal 308 and the semiconductor wafer 302. When the adhesive film 310 is organic, curing the adhesive film 310 may include changing the properties of the adhesive film 310 by chemical reaction, which may involve a physical change to a hardened state. The adhesive film 310 may be cured, for example, using heat, using ultraviolet (UV) light, or using a light-emitting diode (LED). In an implementation, curing an adhesive film 310 includes placing an epoxy film on a warpage compensation metal 308 and a semiconductor wafer 302 and exposing it to an ultraviolet (UV) light for a sufficient time to fully cure and harden. When the adhesive film 310 is non-organic (e.g., sputter metal layers), curing may include methods such as thermal baking, annealing, etc.). It is necessary to fully cure the adhesive film 310 in order to prevent subsequent delamination or other separation of the warpage compensation metal 308 from the semiconductor wafer 302.

Once the wafer fabrication process is complete, suitable wafer-level packaging processes may be employed to segment and package the integrated circuit chips 304 into semiconductor devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A package device, comprising:
at least one semiconductor wafer having at least one integrated circuit device formed therein;
at least one metal feature formed on a device side of the at least one semiconductor wafer;
a warpage compensation metal disposed on a backside of the at least one semiconductor wafer, the warpage compensation metal comprising a composite of multiple metals, and the warpage compensation metal substantially having the same diameter as the at least one semiconductor wafer, and wherein a coefficient of thermal expansion and a Young's modulus of the warpage compensation metal and the coefficient of thermal expansion and the Young's modulus of the at least one metal feature are matched; and
an adhesive film disposed between the at least one semiconductor wafer and the warpage compensation metal, wherein the adhesive film has coefficient of thermal expansion between the coefficient of thermal expansion of the at least one semiconductor wafer and the coefficient of thermal expansion of the warpage compensation metal.

2. The package device as recited in claim 1, wherein the at least one metal feature comprises at least one of copper, nickel, tin, tin-silver, where the feature is greater than 30 µm in thickness.

3. The package device as recited in claim 1, wherein the warpage compensation metal comprises metal film between about 20 µm and 40 µm.

4. The package device as recited in claim 1, wherein the warpage compensation metal comprises a composite of at least two metals.

5. The package device as recited in claim 1, wherein the warpage compensation metal comprises at least one of a blanket film configured to be patterned or a patterned warpage compensation metal configured to expose at least one die street.

6. The package device as recited in claim 1, wherein the adhesive film comprises an adhesive film between about 5 µm and 20 µm.

7. The package device as recited in claim 1, wherein the adhesive film comprises an adhesive film configured to function as at least a partial barrier to copper migration.

8. The package device as recited in claim 1, wherein the adhesive film comprises a thermally conductive adhesive film.

9. The package device as recited in claim 1, wherein the at least one metal feature and the warpage compensation metal have a coefficient of thermal expansion between 2.6 parts per million/° C. and 17 parts per million/° C.

10. A semiconductor device, comprising:
    at least one integrated circuit chip;
    at least one metal feature formed on a device side of the at least one integrated circuit chip;
    a warpage compensation metal disposed on a backside of the at least one integrated circuit chip, the warpage compensation metal comprising a composite of multiple metals, and the warpage compensation metal substantially having the same diameter as the at least one semiconductor wafer, and wherein a coefficient of thermal expansion and a Young's modulus of the warpage compensation metal and the coefficient of thermal expansion and the Young's modulus of the at least one metal feature are matched; and
    an adhesive film disposed between the at least one integrated circuit chip and the warpage compensation metal, wherein the adhesive film has coefficient of thermal expansion between the coefficient of thermal expansion of the at least one semiconductor wafer and the coefficient of thermal expansion of the warpage compensation metal.

11. The semiconductor device as recited in claim 10, wherein the at least one metal feature comprises at least one copper feature greater than 30 µm in thickness.

12. The semiconductor device as recited in claim 10, wherein the warpage compensation metal comprises copper film between about 20 µm and 40 µm.

13. The semiconductor device as recited in claim 10, wherein the adhesive film comprises an adhesive film between about 5 µm and 20 µm.

14. A process comprising:
    processing at least one semiconductor wafer to form at least one integrated circuit therein;
    forming at least one metal feature on a device side of the at least one semiconductor wafer;
    laminating an adhesive film to a backside of the at least one semiconductor wafer;
    placing a warpage compensation metal on the adhesive film, the warpage compensation metal comprising a composite of multiple metals, and the warpage compensation metal substantially having the same diameter as the at least one semiconductor wafer, and wherein the warpage compensation metal is patterned to expose die streets; and
    curing the adhesive film, wherein curing the adhesive film comprises:
    placing an epoxy film on the warpage compensation metal and at least one semiconductor wafer; and
    exposing the epoxy film to an ultraviolet light until the adhesive film is cured.

15. The process as recited in claim 14, wherein forming the at least one metal feature comprises forming at least one copper feature greater than 30 µm in thickness.

16. The process as recited in claim 14, wherein laminating an adhesive film to a backside of the at least one semiconductor wafer comprises laminating an adhesive film between about 5 µm and 20 µm in thickness.

17. The process as recited in claim 14, wherein placing a warpage compensation metal on the adhesive film comprises placing the warpage compensation metal between about 20 µm and 40 µm in thickness.

18. The process as recited in claim 14, wherein curing the adhesive film comprises curing the adhesive film at a temperature between about 100° C. and about 200° C.

19. The process as recited in claim 14, wherein laminating an adhesive film to a backside of the at least one semiconductor wafer comprises laminating an adhesive film configured to function as at least a partial barrier to copper migration.

* * * * *